United States Patent
Kwon et al.

(10) Patent No.: US 9,195,136 B2
(45) Date of Patent: Nov. 24, 2015

(54) RESIST UNDERLAYER COMPOSITION, METHOD OF FORMING PATTERNS AND SEMICONDUCTOR INTEGRATED CIRCUIT DEVICE INCLUDING THE PATTERNS

(71) Applicants: Hyo-Young Kwon, Uiwang-si (KR); Min-Gyum Kim, Uiwang-si (KR); Jun-Ho Lee, Uiwang-si (KR); Hwan-Sung Cheon, Uiwang-si (KR)

(72) Inventors: Hyo-Young Kwon, Uiwang-si (KR); Min-Gyum Kim, Uiwang-si (KR); Jun-Ho Lee, Uiwang-si (KR); Hwan-Sung Cheon, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/088,509

(22) Filed: Nov. 25, 2013

(65) Prior Publication Data

US 2014/0319659 A1   Oct. 30, 2014

(30) Foreign Application Priority Data

Apr. 25, 2013   (KR) .......................... 10-2013-0046363

(51) Int. Cl.
*H01L 21/302* (2006.01)
*H01L 21/461* (2006.01)
*G03F 7/09* (2006.01)

(52) U.S. Cl.
CPC ..................................... *G03F 7/092* (2013.01)

(58) Field of Classification Search
CPC .................................. G03F 7/092; G03F 7/09
USPC .......... 438/725, 948, 671, 717; 257/632, 642; 528/128
See application file for complete search history.

(56) References Cited

U.S. PATENT DOCUMENTS

| 7,655,386 B2 | 2/2010 | Hyung et al. |
| 8,026,038 B2 | 9/2011 | Ogihara et al. |
| 8,263,321 B2 | 9/2012 | Yoon et al. |
| 8,741,539 B2 * | 6/2014 | Oh et al. ..................... 430/270.1 |
| 8,846,846 B2 * | 9/2014 | Kinsho et al. ................. 528/128 |
| 2006/0204891 A1 * | 9/2006 | Hatakeyama .............. 430/270.1 |
| 2009/0176165 A1 | 7/2009 | Cheon et al. |
| 2011/0177459 A1 * | 7/2011 | Ogihara et al. ............... 430/323 |
| 2012/0064725 A1 * | 3/2012 | Kinsho et al. ................. 438/703 |
| 2012/0153424 A1 | 6/2012 | Oh et al. |
| 2012/0252218 A1 * | 10/2012 | Kori et al. .................... 438/703 |

FOREIGN PATENT DOCUMENTS

| JP | 2010-271654 A | 12/2010 |
| KR | 10-0671120 | 1/2007 |
| KR | 10-0816735 B1 | 3/2008 |
| KR | 10-2008-0062963 A | 7/2008 |
| KR | 10-2009-0053718 A | 5/2009 |
| KR | 10-2011-0086812 A | 4/2010 |
| KR | 10-2010-0072660 A | 7/2010 |
| KR | 10-2012-0127258 A | 11/2012 |
| WO | WO 2008/120855 A1 | 10/2008 |
| WO | WO 2010/041626 A1 | 4/2010 |

OTHER PUBLICATIONS

Search Report dated Sep. 25, 2014 in corresponding Taiwanese Patent Application No. 102142153.

* cited by examiner

*Primary Examiner* — Caridad Everhart

(74) *Attorney, Agent, or Firm* — Lee & Morse, P.C.

(57) ABSTRACT

A resist underlayer composition, a method of forming patterns, and semiconductor integrated circuit device, the composition including a solvent; and a compound including a moiety represented by the following Chemical Formula 1:

[Chemical Formula 1]

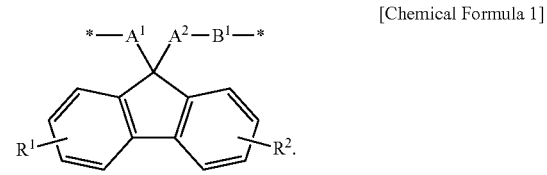

14 Claims, No Drawings

RESIST UNDERLAYER COMPOSITION, METHOD OF FORMING PATTERNS AND SEMICONDUCTOR INTEGRATED CIRCUIT DEVICE INCLUDING THE PATTERNS

CROSS-REFERENCE TO RELATED APPLICATION

Korean Patent Application No. 10-2013-0046363, filed on Apr. 25, 2013, in the Korean Intellectual Property Office, and entitled: "Resist Underlayer Composition, Method of Forming Patterns and Semiconductor Integrated Circuit Device Including The Patterns," is incorporated by reference herein in its entirety.

BACKGROUND

1. Field

Embodiments relate to a resist underlayer composition, a method of forming patterns using the same, and a semiconductor integrated circuit device including the patterns.

2. Description of the Related Art

Recently, developing an ultra-fine technique having a pattern of several to several tens nanometer size has been considered. Such ultrafine techniques require effective lithographic techniques.

One type of lithographic technique may include providing a material layer on a semiconductor substrate; coating a photoresist layer thereon; exposing and developing the same to provide a photoresist pattern; and etching the material layer using the photoresist pattern as a mask.

According to small-sizing the pattern to be formed, it may be difficult to provide a fine pattern having an excellent profile by only above-mentioned typical lithographic technique. Accordingly, a layer, called a hardmask layer, may be formed between the material layer to be etched and the photoresist layer to provide a fine pattern.

SUMMARY

Embodiments are directed to a resist underlayer composition, a method of forming patterns using the same, and a semiconductor integrated circuit device including the patterns.

The embodiments may be realized by providing a resist underlayer composition including a solvent; and a compound including a moiety represented by the following Chemical Formula 1:

[Chemical Formula 1]

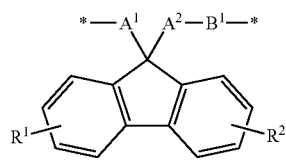

wherein, in Chemical Formula 1, $A^1$ and $A^2$ are each independently one selected from the following Group 1, $B^1$ is one selected from the following Group 2, and $R^1$ and $R^2$ are each independently one selected from hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se,

[Group 1]

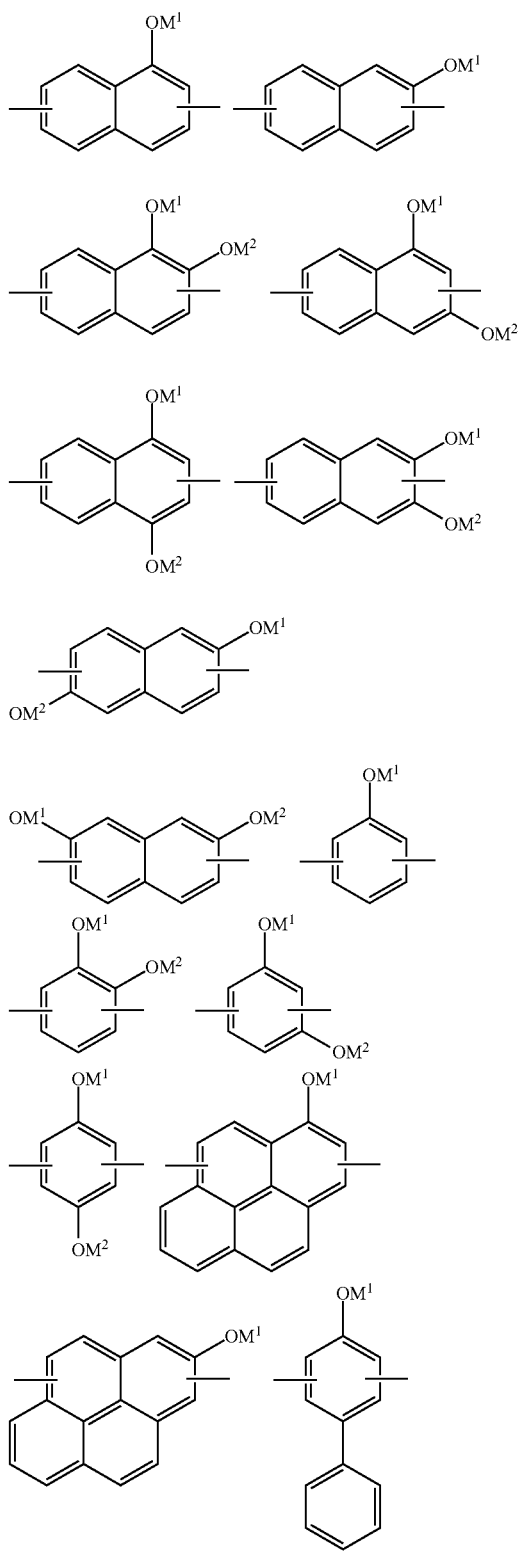

-continued

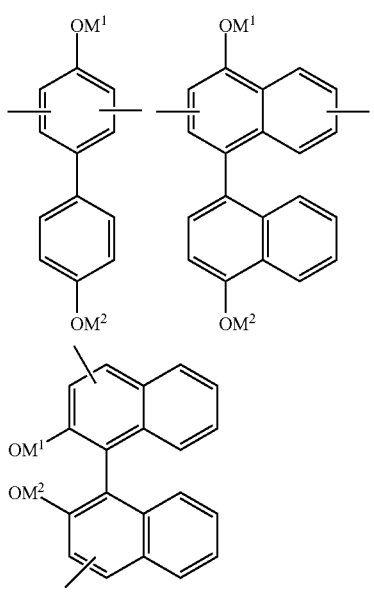

wherein, in Group 1, $M^1$ and $M^2$ are each independently a metal element, a metal complex, C, N, P, S, Se, H, or a combination thereof, provided that in at least one of $A^1$ and $A^2$, $M^1$ or $M^2$ of the Group 1 includes a metal element, a metal complex, P, S, Se, or a combination thereof,

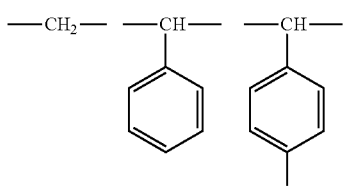

[Group 2]

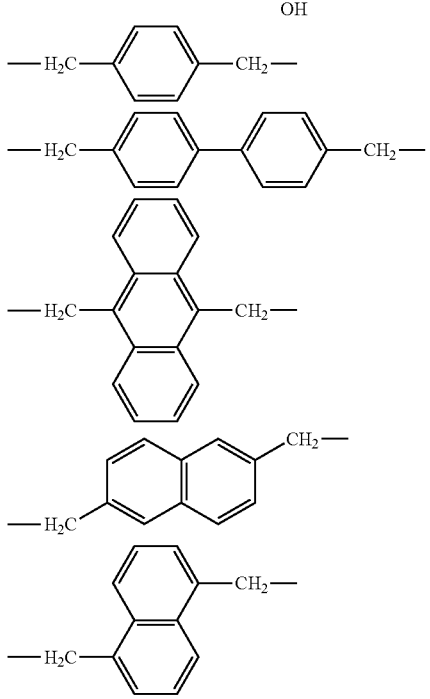

-continued

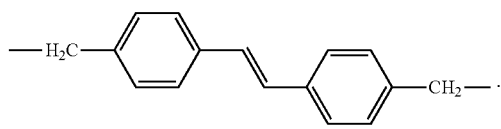

The metal of the metal element or metal complex may be an alkali metal, an alkaline-earth metal, a transition metal, or a post-transition metal.

The metal of the metal element or metal complex may be Sc, Ti, V, Cr, Mn, Fe, Co, Ni, Cu, Zn, Zr, Mo, Ag, Cd, Pt, Au, Hf, Rf, or Rg.

The compound may include a moiety represented by the following Chemical Formula 2:

[Chemical Formula 2]

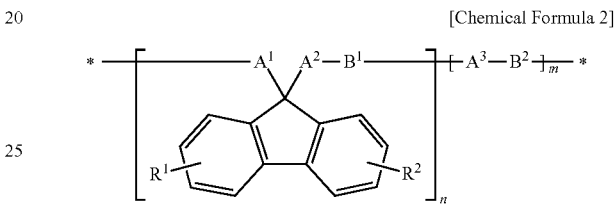

wherein, in Chemical Formula 2, $A^1$, $A^2$, and $A^3$ are each independently one selected from the following Group 1, $B^1$ and $B^2$ are each independently one selected from the following Group 2, $R^1$ and $R^2$ are each independently hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se, $1 \leq n < 750$, $1 \leq m < 750$, and m+n satisfies $2 \leq m+n \leq 1{,}500$,

[Group 1]

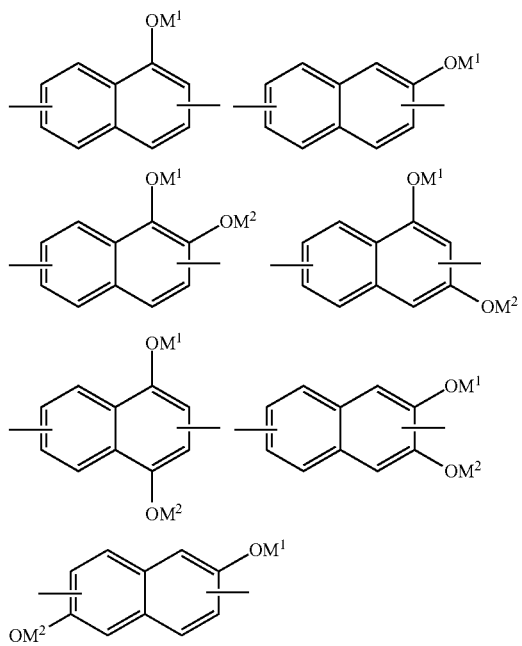

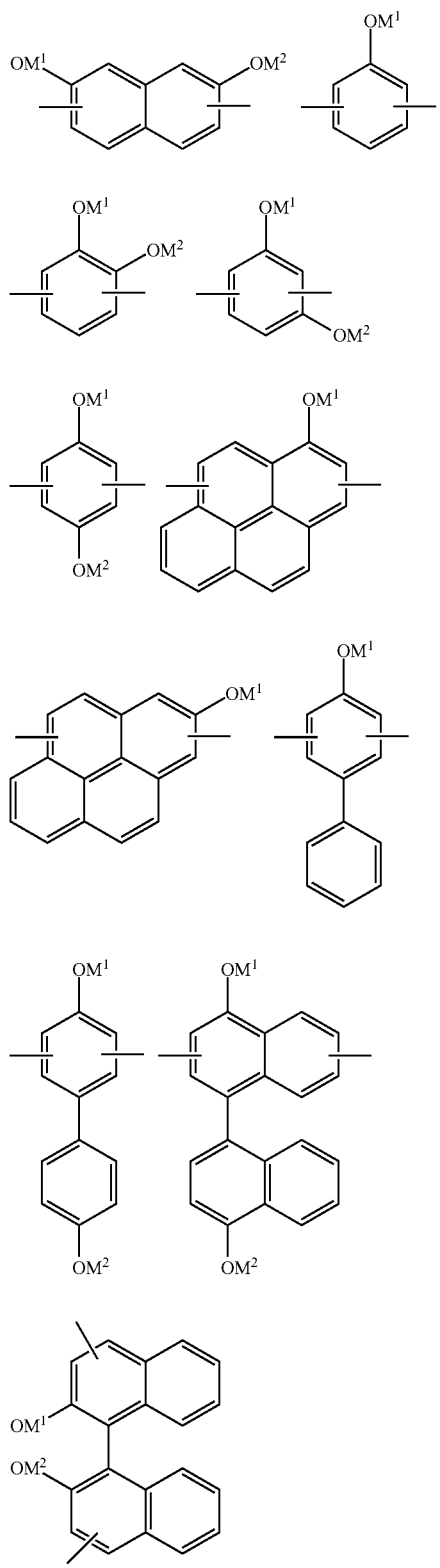

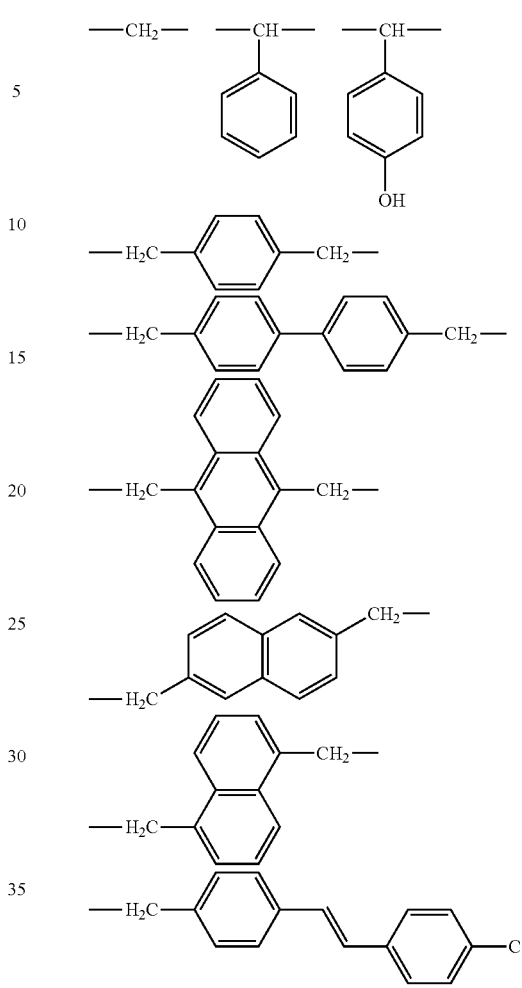

wherein, in the Group 1, $M^1$ and $M^2$ are each independently a metal element, a metal complex, C, N, P, S, Se, H, or a combination thereof, provided that in at least one of $A^1$ and $A^2$, $M^1$ or $M^2$ of the Group 1 includes a metal element, a metal complex, P, S, Se, or a combination thereof, The compound may have a weight average molecular weight of about 1,000 to about 200,000.

The compound may be included in the composition in an amount of about 0.01 wt % to about 50 wt %, based on 100 wt % of the solvent.

The solvent may include at least one of propylene glycol monomethyl ether acetate, propylene glycol monomethyl ether, cyclohexanone, or ethyl lactate.

The resist underlayer composition may further include a cross-linking agent.

The cross-linking agent may include at least one of an amino resin, a glycoluril compound, a bisepoxy compound, a melamine compound, or a melamine derivative.

The cross-linking agent may be included in the composition in an amount of about 0.001 wt % to about 3 wt %, based on 100 wt % of the resist underlayer composition.

The embodiments may also be realized by providing a method of forming patterns, the method including providing a material layer on a substrate, applying the resist underlayer composition according to an embodiment on the material layer, heat-treating the resist underlayer composition to form a resist underlayer, forming a photoresist layer on the resist underlayer, exposing and developing the photoresist layer to form a photoresist pattern, selectively removing the resist underlayer using the photoresist pattern to expose a part of the material layer, and etching an exposed part of the material layer.

The resist underlayer composition may be applied using a spin-on-coating method.

The resist underlayer composition may be heat-treated at about 150° C. to about 500° C.

The method may further include forming a bottom anti-reflective coating prior to forming the resist underlayer.

The embodiments may also be realized by providing a semiconductor integrated circuit device including a plurality of patterns manufactured according to the method of forming patterns according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, when a definition is not otherwise provided, the term 'substituted' may refer to one substituted with at least a substituent selected from a halogen (e.g., F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the term 'hetero' may refer to one including 1 to 3 heteroatoms selected from N, O, S, and P.

Hereinafter, a resist underlayer composition according to an embodiment is described.

A resist underlayer composition according to an embodiment may include a solvent and a compound including a moiety represented by the following Chemical Formula 1.

[Chemical Formula 1]

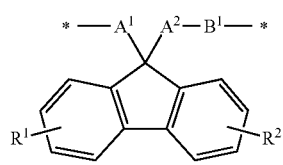

In Chemical Formula 1, $A^1$ and $A^2$ may each independently be selected from the following Group 1, $B^1$ may be selected from the following Group 2, and $R^1$ and $R^2$ may each independently be selected from hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se.

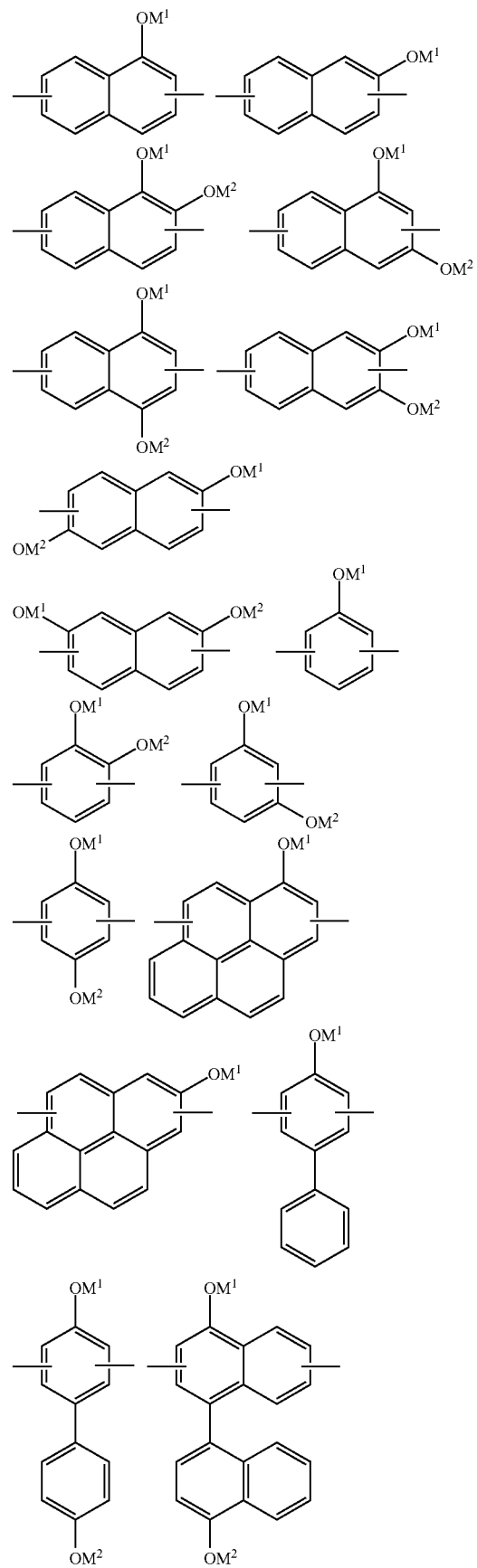

-continued

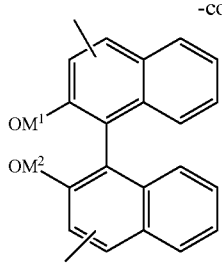

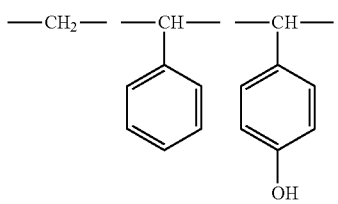 [Group 2]

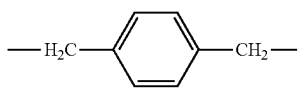

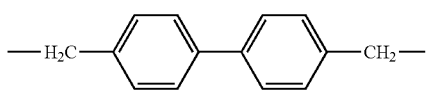

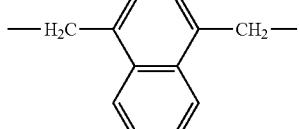

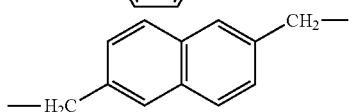

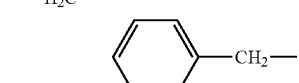

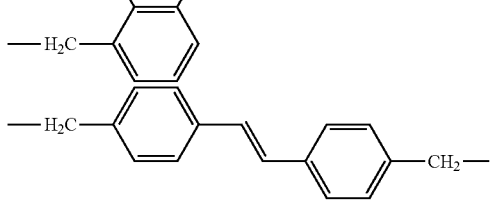

In Chemical Formula 1, the * indicates a point where the moiety may be linked to other moieties, groups, or atoms in the compound.

The moiety represented by the above Chemical Formula 1 includes a fluorene group that may help provide the moiety with a strong absorption at a short wavelength, e.g., 193 nm and/or 248 nm. Accordingly, a resist underlayer formed of the resist underlayer composition (and including the moiety) may exhibit excellent optical properties.

In Group 1, $M^1$ and $M^2$ may each independently be a metal element, a metal complex, C, N, P, S, Se, H, or a combination thereof. For example, when $M^1$ is hydrogen, —$OM^1$ is a hydroxy group (—OH).

As noted above, in Chemical Formula 1, $A^1$ and $A^2$ may each independently be selected from the Group 1. In an implementation, in at least one of $A^1$ and $A^2$, $M^1$ or $M^2$ of the Group 1 may include a metal element, a metal complex, P, S, Se, or a combination thereof. For example, in Chemical Formula 1, $M^1$ or $M^2$ of $A^1$ and/or $A^2$ may not be hydrogen (e.g., may be part of a hydroxy group), and at least one of $M^1$ or $M^2$ of $A^1$ and/or $A^2$ may include a metal element, a metal complex, P, S, Se, or a combination thereof.

In an implementation, the metal complex may include at least one residual group selected from, e.g., an alkoxide group, a phenoxide group, a halide, a hydride, a hydroxy group, a carboxyl group, an amide group, or a mixture thereof. The metal complex may include a metal alkoxide, e.g., an organic titanium compound $(Ti(iPrO)_x)$, an organic zirconium compound $(Zr(OBu)_x)$, or the like. In an implementation, x may be an integer of 0 to 3.

The composition may have a compound with the above structure and thus, a resist underlayer prepared from the composition may exhibit decreased reactivity against etching gas. Accordingly, the decreased reactivity may increase etch resistance. Thus, the resist underlayer prepared from the composition may have sufficient etch resistance.

In the metal element and metal complex, the metal may include a suitable metal. For example the metal may include an alkali metal, an alkaline-earth metal, a transition metal, or a post-transition metal.

In an implementation, the metal may include, e.g., Sc, Ti, V, Cr, Mn, Fe, Co, Ni, Cu, Zn, Zr, Mo, Ag, Cd, Pt, Au, Hf, Rf or Rg.

The moiety represented by the above Chemical Formula 1 may include an aromatic ring, and thus may secure rigid characteristics.

$R^1$ and $R^2$ may represent a substituent substituted on the fluorene backbone. Properties of the substituent may have no particular limit to position and number, and may be adjusted by controlling or selecting the position and number of the substituent.

For example, when the $R^1$ or $R^2$ is a hydroxy group, dissolution and cross-linking may be improved. Accordingly, the resist underlayer composition and/or the resist underlayer prepared from the composition may exhibit chemical resistance. For example, a C1 to C10 alkoxy group substituted with at least one metal element, P, S, or Se may help further improve etch resistance of the resist underlayer prepared from the composition. Herein, the metal may be a suitable metal. For example, the metal may include an alkali metal, an alkaline-earth metal, a transition metal, or a post-transition metal. In an implementation, the metal may include, e.g., Sc, Ti, V, Cr, Mn, Fe, Co, Ni, Cu, Zn, Zr, Mo, Ag, Cd, Pt, Au, Hf, Rf, or Rg.

In an implementation, the compound may include a moiety represented by the following Chemical Formula 2.

[Chemical Formula 2]

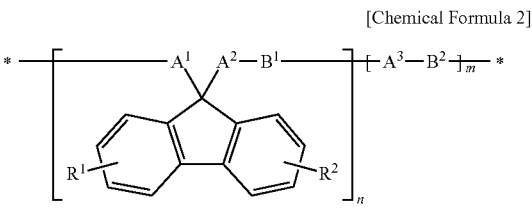

In Chemical Formula 2, $A^1$, $A^2$, and $A^3$ may each independently be selected from the following Group 1, $B^1$ and $B^2$ may each independently be selected from the following Group 2, and $R^1$ and $R^2$ may each independently be selected from hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se.

In Chemical Formula 2, the * indicates a point where the moiety may be linked to other moieties, groups, or atoms in the compound.

The m and n indicate a relative mole ratio of a repeating unit. In an implementation, $1 \leq n < 750$, $1 \leq m < 750$, and m+n satisfies $2 \leq m+n \leq 1,500$.

In the above Chemical Formula 2, the moiety bracketed by m is a second repeating unit that may help reinforce etch resistance of the resist underlayer prepared from the composition. In an implementation, the moiety bracketed by m may be omitted, or the compound may include more than two different ones of the moiety bracketed by m.

In the above Chemical Formula 2, the first (e.g., bracketed by n) and second (e.g., bracketed by m) repeating units may be arranged in a different order, e.g., as blocks, regularly, or randomly.

In the Chemical Formula 2, $A^1$ and $A^2$ may each independently be selected from Group 1. In an implementation, in at least one of $A^1$ and $A^2$, $M^1$ or $M^2$ of the Group 1 may include a metal element, a metal complex, P, S, Se, or a combination thereof.

The compound and/or the resist underlayer prepared from the composition including the compound may exhibit etch resistance, chemical resistance, and optical properties, due to the moiety represented by the above Chemical Formula 2.

The compound may have a weight average molecular weight of about 1,000 to about 200,000. By having the weight average molecular weight within the above range, dissolution and coating properties of resist underlayer composition may be improved. In an implementation, the compound may have a weight average molecular weight of about 5,000 to about 100,000.

The solvent may be a suitable solvent having sufficient dissolubility or dispersion for the compound. In an implementation, the solvent may include, e.g., propyleneglycol, propyleneglycol diacetate, methoxy propanediol, diethyleneglycol, diethyleneglycol butylether, tri(ethyleneglycol) monomethyl ether, propyleneglycol monomethyl ether, propyleneglycol monomethyl ether acetate, cyclohexanone (or referred to be 'anone'), ethyllactate, gamma-butyrolactone, or acetylacetone.

The compound may be included in the composition in an amount of about 0.01 wt % to about 50 wt %, based on 100 wt % of the solvent. Within the range, solubility and coating properties during a film forming process of the resist underlayer composition may be improved. In an implementation, the compound may be included in the composition in an amount of about 0.3 wt % to about 20 wt %.

In an implementation, the resist underlayer composition may further include an additive. The additive may include, e.g., a surfactant, a cross-linking agent, or the like.

The surfactant may include, e.g., an alkyl benzenesulfonate salt, an alkyl pyridinium salt, a polyethylene glycol, a quaternary ammonium salt, or the like.

The cross-linking agent may help cross-link repeating units of the polymer through heating. The cross-linking agent may include, e.g., an amino resin such as etherified amino resin; a glycoluril compound such as a compound represented by the following Chemical Formula A; a bisepoxy compound such as a compound represented by the following Chemical Formula B; melamine or a derivative such as for example N-methoxymethyl melamine, N-butoxymethyl melamine or a melamine derivative represented by the following Chemical Formula C; or a mixture thereof.

[Chemical Formula A]

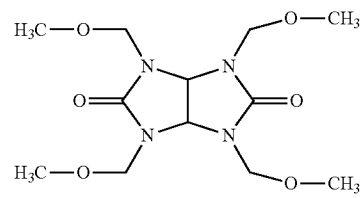

[Chemical Formula B]

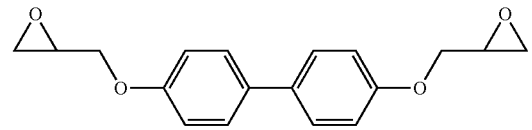

[Chemical Formula C]

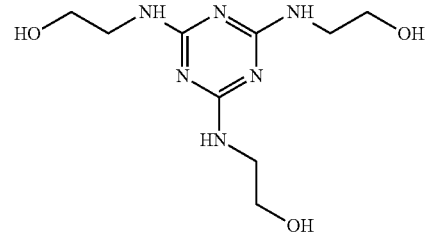

The surfactant and cross-linking agent may each independently be included in an amount of about 0.001 wt % to 3 wt %, based on 100 wt % of the resist underlayer composition. When included in the range, the solubility and the cross-linking property may be ensured without changing the optical properties of the resist underlayer composition.

The resist underlayer composition may not be dissolved in a resist solvent and/or a resist developing solution and may not mixed with the resist solution. Thus, the resist underlayer composition may be chemically stable during use.

Hereinafter, a method of forming patterns using the resist underlayer composition is described.

The method of forming patterns according to an embodiment may include providing a material layer on a substrate, applying a resist underlayer composition (according to an embodiment, e.g., including the compound described above and a solvent) on the material layer, heat-treating the resist underlayer composition to form a resist underlayer, forming a resist layer on the resist underlayer, exposing and developing the resist layer to form a resist pattern, selectively removing the resist underlayer using the resist pattern to expose a part of the material layer, and etching an exposed part of the material layer.

The substrate may include, e.g., a silicon wafer, a glass substrate, or a polymer substrate.

The material layer may be a material to be finally patterned and may include, e.g., a metal layer such as aluminum, copper, or the like, a semiconductor layer such as silicon, or an insulation layer such as silicon oxide, silicon nitride, or the like. The material layer may be formed by, e.g., a chemical vapor deposition (CVD).

In an implementation, the resist underlayer composition may be prepared in a solution and may be applied by a spin-on-coating method. A coating thickness of resist underlayer composition may be, e.g., about 80 to about 10,000 Å.

In an implementation, a bottom anti-reflective coating (BARC) may be further formed prior to forming the resist underlayer.

The resist underlayer composition may be heat-treated at, e.g., about 150° C. to about 500° C. During the heat-treating, the compound may be cross-linked.

The exposing of the resist layer may be performed by using, e.g., ArF, KrF, or EUV, or the like. In addition, after the exposure of the resist layer, another heat treatment may be performed at about 100° C. to about 500° C.

The exposed part of the material layer may be etched by dry etching using etching gas. The etching gas may include, e.g., $CHF_3$, $CF_4$, $Cl_2$, $BCl_3$, or a mixed gas thereof.

The etched material layer may be formed in a plurality of patterns. The plurality of patterns may have various forms, e.g., a metal pattern, a semiconductor pattern, an insulation pattern, or the like. For example, it may be applied to various patterns in a semiconductor integrated circuit device.

The patterns in the semiconductor integrated circuit device may include, e.g., a metal wire; a semiconductor pattern; an insulation layer including a contact hole, a bias hole, damascene trench, or the like.

The following Examples and Comparative Examples are provided in order to highlight characteristics of one or more embodiments, but it will be understood that the Examples and Comparative Examples are not to be construed as limiting the scope of the embodiments. Further, it will be understood that the embodiments are not limited to the particular details described in the Examples and Comparative Examples.

SYNTHESIS EXAMPLES

Comparative Synthesis Example 1

225 g (0.5 mol) of 9,9'-bishydroxynaphthylfluorene, 72 g (0.5 mol) of 1-naphthol, 1.55 g (0.01 mol) of diethylsulfate, and 175 g of propylene glycol monomethyl ether were put in a flask and then, agitated while maintained at 100° C. After 10 minutes, 266 g (1.0 mol) of 9,10-bismethoxymethyl anthracene was slowly added thereto, and the mixture was heated up to 120° C. and reacted for 15 hours. Subsequently, 1.49 g (0.01 mol) of triethanolamine as a neutralizer was added to the resultant, completing the reaction. Subsequently, a mixture of water and methanol was used to remove acid therein. Subsequently, methanol was used to remove a low molecular weight containing an oligomer and a monomer, obtaining a compound represented by the following Chemical Formula 3.

[Chemical Formula 3]

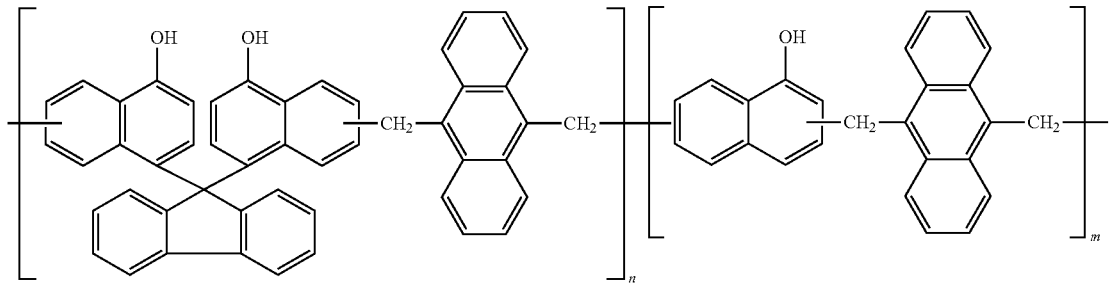

(n = 10, m = 9)

The weight average molecular weight (Mw) of the compound was 10,000, and the polydispersity (Mw/Mn) of the compound was 2.0.

Synthesis Example 1

10 g of the compound according to Comparative Synthesis Example 1 was dissolved in 100 g of $CH_2Cl_2$, and 1 g of $Ti(iOPr)_4$ was additionally added thereto in an ice bath. The resultant was reacted at room temperature for 12 hours, and then, a volatile side reactant and an organic solvent were removed therefrom, obtaining a compound represented by the following Chemical Formula 4.

[Chemical Formula 4]

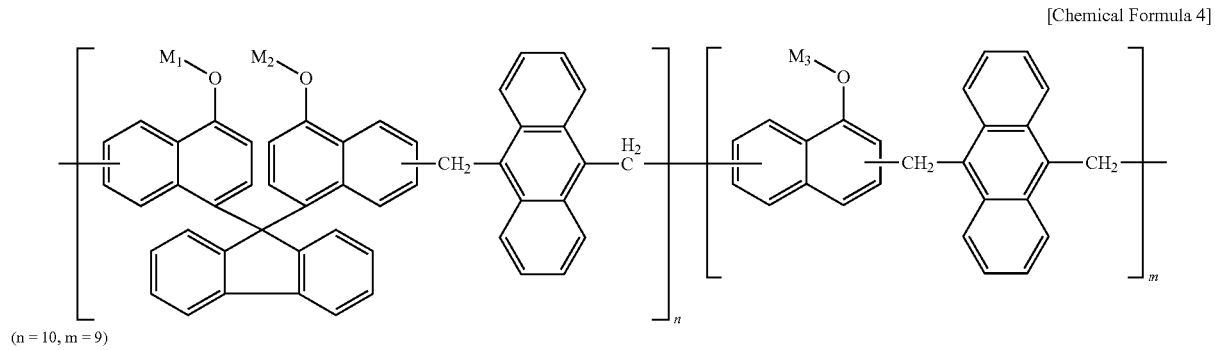

(n = 10, m = 9)

In the above Chemical Formula 4, $M^1$ to $M^2$ were each independently hydrogen or an organic titanium compound $(Ti(iPrO)_x)$, such that at least one of the $M^1$ to $M^2$ was the organic titanium compound $(Ti(iPrO)_x)$, and the $M^3$ was the organic titanium compound $(Ti(iPrO)_x)$.

The x was an integer ranging from 0 to 3.

Comparative Synthesis Example 2

A compound represented by the following Chemical Formula 5 was prepared according to the same method as Comparative Synthesis Example 1 except for using 94.1 g of phenol instead of the 1-naphthol and 60.1 g of formaldehyde instead of the 9,10-bismethoxymethyl anthracene.

[Chemical Formula 5]

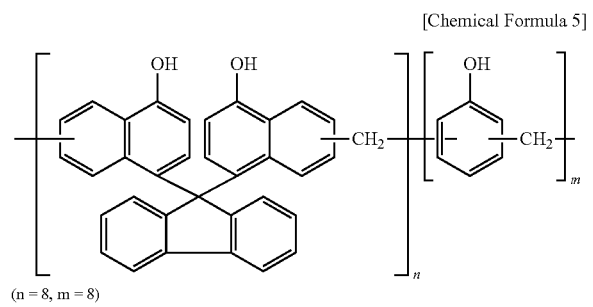

(n = 8, m = 8)

The weight average molecular weight (Mw) of the compound was 10,000, and the polydispersity (Mw/Mn) of the compound was 1.8.

Synthesis Example 2

10 g of the compound according to Comparative Synthesis Example 2 was dissolved in 100 g of $CH_2Cl_2$, and 1 g of $Ti(iOPr)_4$ was additionally added thereto in an ice bath. The resultant was reacted at room temperature for 12 hours, and a volatile side reactant and an organic solvent were removed therefrom, obtaining a compound represented by the following Chemical Formula 6.

[Chemical Formula 6]

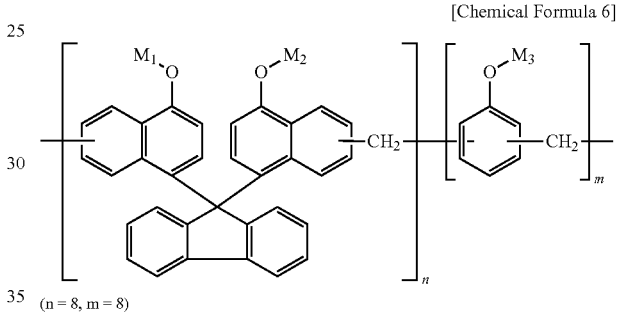

(n = 8, m = 8)

In the above Chemical Formula 6, $M^1$ to $M^2$ were each independently hydrogen or an organic titanium compound $(Ti(iPrO)_x)$, such that at least either one of the $M^1$ to $M^2$ was the organic titanium compound $(Ti(iPrO)_x)$, and the $M^3$ was the organic titanium compound $(Ti(iPrO)_x)$.

The x was an integer ranging from 0 to 3.

Comparative Synthesis Example 3

350.41 g (1.0 mol) of 9,9-bishydroxyphenylfluorene, 3.08 g (0.02 mol) of diethylsulfate, and 350 g of propylene glycol monomethyl ether were put in a flask and agitated while maintained at 100° C. Ten minutes later, 166.22 g (1 mol) of 1,4-bismethoxymethylbenzene was added thereto in a dropwise fashion, and the mixture was reacted at the temperature for 15 hours. Subsequently, 2.98 g (0.02 mol) of triethanolamine as a neutralizer was added to the resultant, completing the reaction. Subsequently, a mixture of water and methanol was used to remove acid therefrom. Subsequently, methanol was used to remove a low molecular weight containing an oligomer and a monomer, obtaining a compound represented by the following Chemical Formula 7.

[Chemical Formula 7]

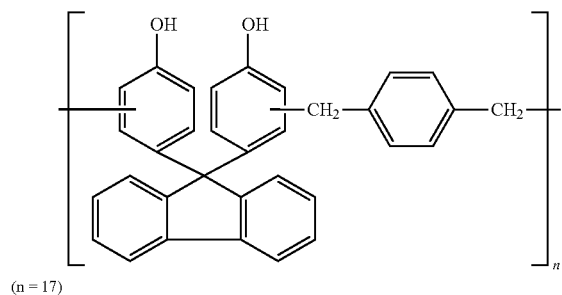

(n = 17)

The weight average molecular weight (Mw) of the compound was 10,000, and the polydispersity (Mw/Mn) of the compound was 2.0.

Synthesis Example 3

10 g of the compound according to Comparative Synthesis Example 3 was dissolved in 100 g of $CH_2Cl_2$, and 1 g of $Zr(nOBu)_4$ was additionally added thereto in an ice bath. The resultant was reacted at room temperature for 12 hours, and a volatile side reactant and an organic solvent was removed therefrom, obtaining a compound represented by the following Chemical Formula 8.

[Chemical Formula 8]

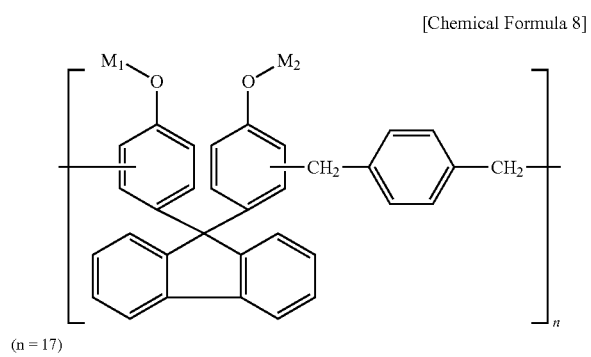

(n = 17)

In the above Chemical Formula 8, $M^1$ to $M^2$ were each independently hydrogen or an organic zirconium compound $(Zr(nOBu)_x)$, such that at least one of the $M^1$ to $M^2$ was the organic zirconium compound $(Zr(nOBu)_x)$.

The x was an integer ranging from 0 to 3.

Comparative Synthesis Example 4

A compound represented by the following Chemical Formula 9 was obtained according to the same method as Comparative Synthesis Example 3, except for using 242.31 g of 4,4'-bismethoxymethyl-bisphenyl instead of the 1,4-bismethoxymethylbenzene.

[Chemical Formula 9]

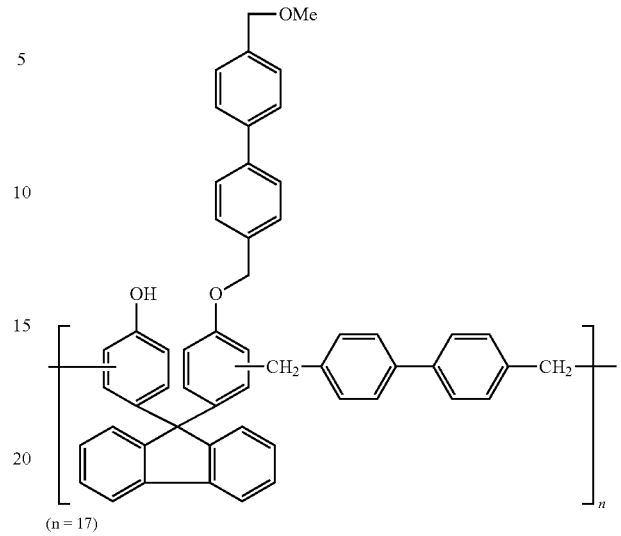

(n = 17)

The weight average molecular weight (Mw) of the compound was 11,000, and the polydispersity (Mw/Mn) of the compound was 2.0.

Synthesis Example 4

10 g of the compound according to Comparative Synthesis Example 4 was dissolved in 100 g of $CH_2Cl_2$, and 1 g of $Zr(nOBu)_4$ was additionally added thereto in an ice bath. The mixture was reacted at room temperature for 12 hours, and a volatile side reactant and an organic solvent was removed therefrom, obtaining a compound represented by the following Chemical Formula 10.

[Chemical Formula 10]

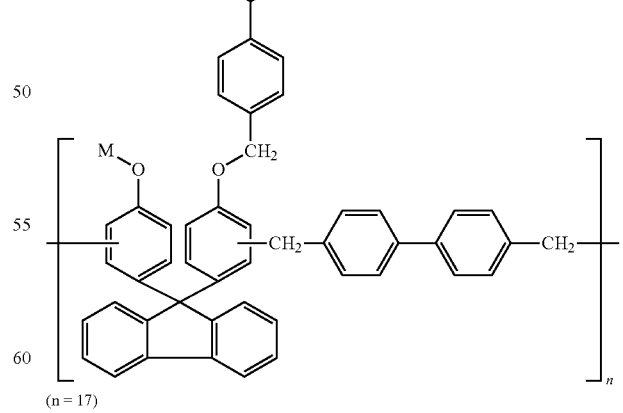

(n = 17)

In the above Chemical Formula 10, M was an organic zirconium compound $(Zr(nOBu)_x)$.

The x was an integer ranging from 0 to 3.

Preparation of Resist Underlayer Composition

Example 1

0.8 g of the compound according to Synthesis Example 1, 0.2 g of a cross-linking agent PD1174, manufactured by TCI), and 2 mg of pyridium p-toluene sulfonate (PPTS) were dissolved in 9 g of propylene glycol monomethyl ether acetate (PGMEA), and then, the solution was filtered, preparing a resist underlayer composition.

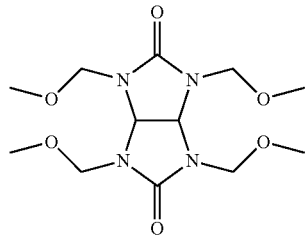

[PD1174]

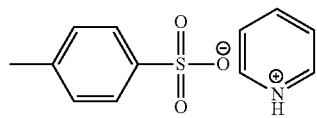

[PPTS]

Example 2

A resist underlayer composition was prepared according to the same method as Example 1 except for using the compound according to Synthesis Example 2 instead of the compound according to Synthesis Example 1.

Example 3

A resist underlayer composition was prepared according to the same method as Example 1 except for using the compound according to Synthesis Example 3 instead of the compound according to Synthesis Example 1.

Example 4

A resist underlayer composition was prepared according to the same method as Example 1 except for using the compound according to Synthesis Example 4 instead of the compound according to Synthesis Example 1.

Comparative Example 1

A resist underlayer composition was prepared according to the same method as Example 1 except for using the compound according to Comparative Synthesis Example 1 instead of the compound according to Synthesis Example 1.

Comparative Example 2

A resist underlayer composition was prepared according to the same method as Example 1 except for using the compound according to Comparative Synthesis Example 2 instead of the compound according to Synthesis Example 1.

Comparative Example 3

A resist underlayer composition was prepared according to the same method as Example 1 except for using the compound according to Comparative Synthesis Example 3 instead of the compound according to Synthesis Example 1.

Comparative Example 4

A resist underlayer composition was prepared according to the same method as Example 1 except for using the compound according to Comparative Synthesis Example 4 instead of the compound according to Synthesis Example 1.

Evaluation 1: Optical Properties

Each resist underlayer composition according to Examples 1 to 4 and Comparative Examples 1 to 4 was spin-coated on a silicon wafer and baked at 200° C. for 60 second, forming a 4,000 Å-thick hardmask layer. The refractive index (n) and extinction coefficient (k) of each hardmask layer were measured by using an Ellipsometer (J. A. Woollam).

The results are shown in Table 1, below.

TABLE 1

|  | Optical properties (193 nm) | | Optical properties (248 nm) | |
| --- | --- | --- | --- | --- |
|  | n | k | N | k |
| Example 1 | 1.52 | 0.71 | 1.97 | 0.39 |
| Example 2 | 1.44 | 0.87 | 2.02 | 0.27 |
| Example 3 | 1.44 | 0.80 | 2.01 | 0.25 |
| Example 4 | 1.47 | 0.75 | 1.81 | 0.29 |
| Comparative Example 1 | 1.47 | 0.65 | 1.90 | 0.20 |
| Comparative Example 2 | 1.43 | 0.30 | 2.11 | 0.28 |
| Comparative Example 3 | 1.44 | 0.71 | 1.80 | 0.06 |
| Comparative Example 4 | 1.43 | 0.69 | 1.83 | 0.07 |

Referring to Table 1, the resist underlayer compositions according to Examples 1 to 4 had a refractive index and absorption degree usable as an antireflective film at ArF (193 nm) and KrF (248 nm) wavelengths.

Evaluation 2: Chemical Resistance

The resist underlayer compositions according to Examples 1 to 4 and Comparative Examples 1 to 4 were respectively spin-coated on a silicon wafer and heat-treated at 240° C. for 120 seconds to form each thin film, and then, the thickness of the thin films was measured, and the surface of the thin films was examined. Subsequently, the thin films were dipped in a KrF thinner for 1 minute, and then, the thickness of the thin films was measured, and the surface of the thin films was examined again.

Subsequently, a film was formed under the same condition as aforementioned except for changing the heat treatment temperature from 240° C. to 400° C. to measure its thickness and examine its surface.

A thickness decrease rate was calculated based on thin film thicknesses before and after the dipping based on the following Calculation Equation 1.

Thickness decrease rate (%)=(thin film thickness before dipping−thin film thickness after dipping)/thin film thickness before dipping×100  [Calculation Equation 1]

The results are shown in Table 2, below.

TABLE 2

|  | 240° C. condition | | 400° C. condition | |
| --- | --- | --- | --- | --- |
|  | Stains on surface of thin film | Thickness decrease rates between before and after being dipped in thinner | Stains on surface of thin film | Thickness decrease rates between before and after being dipped in thinner |
| Example 1 | X | 0.7% | X | 0.17% |
| Example 2 | X | 0.46% | X | 0.08% |
| Example 3 | X | 0.31% | X | 0.20% |
| Example 4 | X | 0.1% | X | 0.03% |
| Comparative Example 1 | ○ | 4% | X | 3% |
| Comparative Example 2 | ○ | 1% | X | 0.9% |
| Comparative Example 3 | ○ | 2% | X | 1% |
| Comparative Example 4 | ○ | 1.2% | X | 0.8% |

Referring to Table 2, the thin films formed of the resist underlayer compositions according to Comparative Examples 1 to 4 exhibited a spot thereon at 240° C. On the other hand, the thin films formed of the resist underlayer compositions according to Examples 1 to 4 had no spot on the surface at both of 240° C. and 400° C. and showed chemical resistance, compared with the thin films formed of the resist underlayer compositions according to Comparative Examples 1 to 4.

In addition, the thin films formed of the resist underlayer compositions according to Examples 1 to 4 exhibited a smaller thickness difference before and after dipping than that of the thin films formed of the resist underlayer compositions according to Comparative Examples 1 to 4.

For example, the resist underlayer compositions according to Examples 1 to 4 exhibited a relatively higher cross-linking degree than that of the resist underlayer compositions according to Comparative Examples 1 to 4. Accordingly, the resist underlayer compositions according to Example 1 to 4 exhibited excellent chemical resistance.

Evaluation 3: Etch Resistance

The resist underlayer compositions according to Examples 1 to 4 and Comparative Examples 1 to 4 were respectively spin-coated on a silicon wafer and heat-treated at 240° C. for 120 seconds, and then, the thickness of the thin films was measured.

Subsequently, the thin films were dry-etched with a $N_2/O_2$ mixed gas for 60 seconds and the thickness was measured. In addition, the thin films were dry-etched by using $CF_x$ gas for 100 seconds and then, the thickness was measured.

A bulk etching rate (BER) was calculated based on thickness of a thin film before and after dry etching and etching time according to the following Calculation Equation 2.

(Initial thin film thickness–thin film thickness after etching)/etching time (Å/s)　　　[Calculation Equation 2]

The results are shown in Table 3, below.

TABLE 3

|  | $CF_x$ | $N_2/O_2$ |
| --- | --- | --- |
| Example 1 | 15.37 | 12.6 |
| Example 2 | 16.65 | 14.03 |
| Example 3 | 16.01 | 13.98 |
| Example 4 | 15.28 | 12.86 |
| Comparative Example 1 | 34.74 | 28.65 |
| Comparative Example 2 | 37.25 | 24.12 |
| Comparative Example 3 | 35.67 | 26.12 |
| Comparative Example 4 | 39.23 | 27.02 |

Referring to Table 3, the thin films formed of the resist underlayer compositions according to Examples 1 to 4 exhibited sufficient etch resistance and a low etching rate by an etching gas, compared with that of the thin films formed of the resist underlayer compositions according to Comparative Examples 1 to 4.

By way of summation and review, a hardmask layer may be formed by a spin-on coating method or chemical vapor deposition. The hardmask layer may play a role of an intermediate layer for transferring the fine pattern of photoresist to the material layer through a selective etching process. Accordingly, the hardmask layer may have etch resistance and chemical resistance to be tolerated during the multiple etching processes, and optical properties for use an anti-reflective barrier film.

The embodiments may provide a resist underlayer composition being capable of improving etch resistance and chemical resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resist underlayer composition, comprising:
a solvent; and
a compound including a moiety represented by the following Chemical Formula 1:

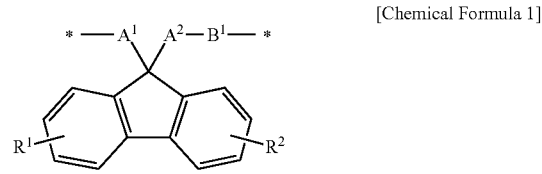

[Chemical Formula 1]

wherein, in Chemical Formula 1,
$A^1$ and $A^2$ are each independently one selected from the following Group 1,
$B^1$ is one selected from the following Group 2, and
$R^1$ and $R^2$ are each independently one selected from hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se,

[Group 1]

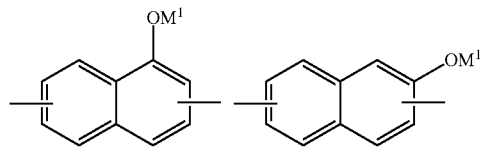
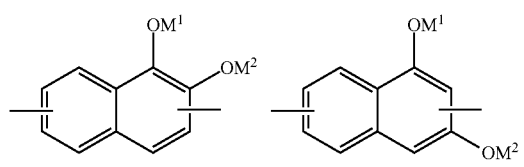
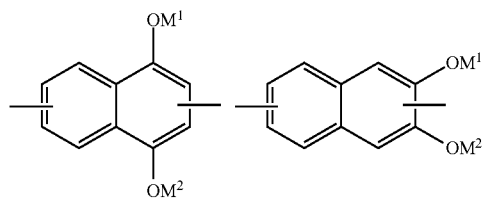
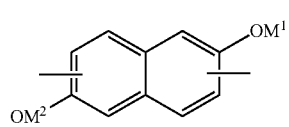
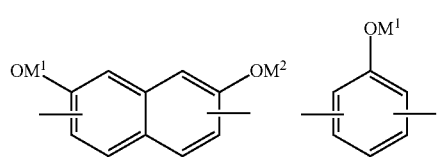
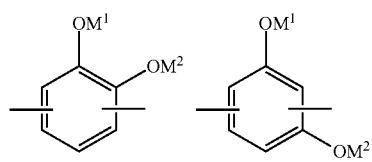
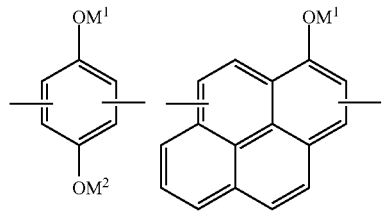
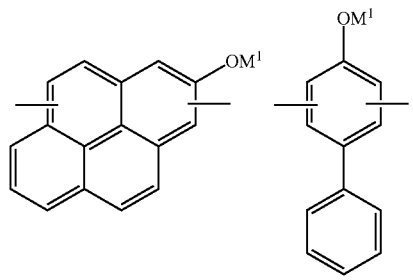

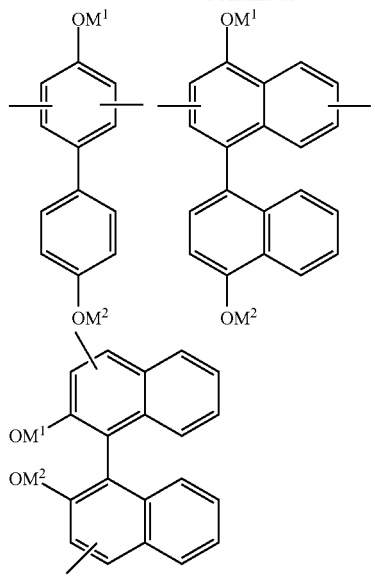

wherein, in Group 1, $M^1$ and $M^2$ are each independently a metal element, a metal complex, C, N, P, S, Se, H, or a combination thereof, provided that in at least one of $A^1$ and $A^2$, $M^1$ or $M^2$ of the Group 1 includes a metal element, a metal complex, P, S, Se, or a combination thereof,

[Group 2]

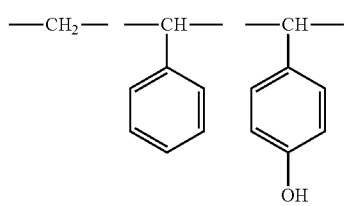
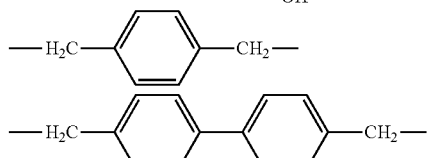
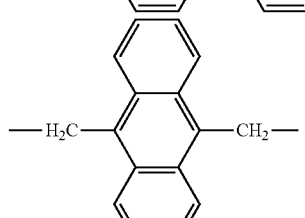
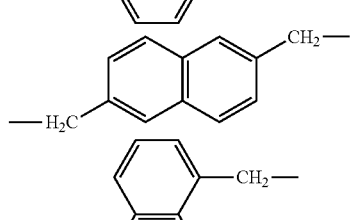

-continued

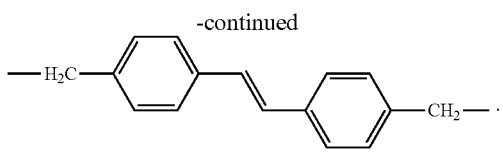

2. The resist underlayer composition as claimed in claim 1, wherein the metal of the metal element or metal complex is an alkali metal, an alkaline-earth metal, a transition metal, or a post-transition metal.

3. The resist underlayer composition as claimed in claim 1, wherein the metal of the metal element or metal complex is Sc, Ti, V, Cr, Mn, Fe, Co, Ni, Cu, Zn, Zr, Mo, Ag, Cd, Pt, Au, Hf, Rf, or Rg.

4. The resist underlayer composition as claimed in claim 1, wherein the compound includes a moiety represented by the following Chemical Formula 2:

[Chemical Formula 2]

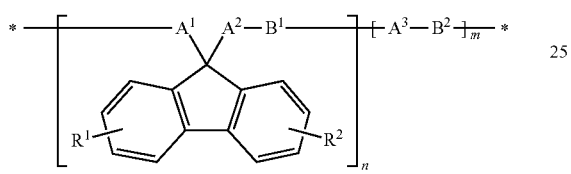

wherein, in Chemical Formula 2, $A^1$, $A^2$, and $A^3$ are each independently one selected from the following Group 1, $B^1$ and $B^2$ are each independently one selected from the following Group 2, $R^1$ and $R^2$ are each independently hydrogen, a hydroxy group, a substituted or unsubstituted C1 to C10 alkyl group, a substituted or unsubstituted C6 to C10 aryl group, an allyl group, a halogen, or a C1 to C10 alkoxy group substituted with a metal element, P, S, or Se, $1 \leq n < 750$, $1 \leq m < 750$, and m+n satisfies $2 \leq m+n < 1{,}500$,

[Group 1]

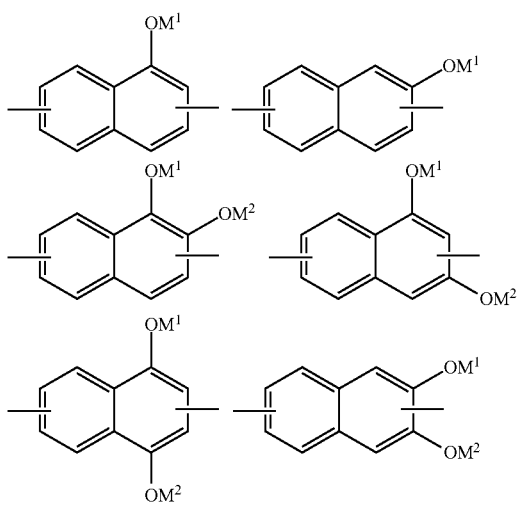

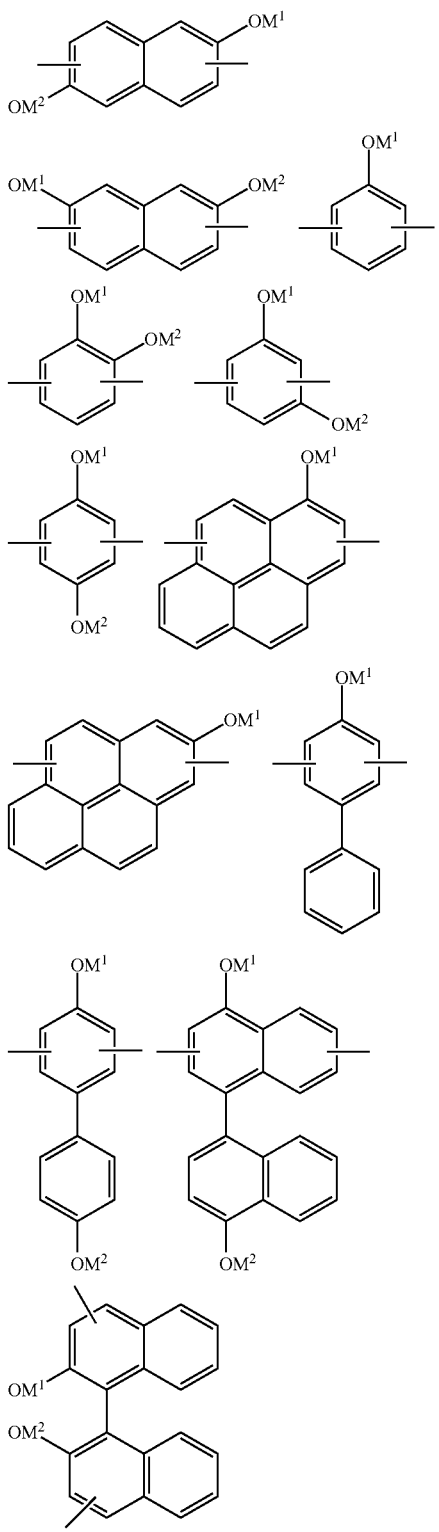

wherein, in Group 1, $M^1$ and $M^2$ are each independently a metal element, a metal complex, C, N, P, S, Se, H, or a combination thereof, provided that in at least one of $A^1$ and $A^2$, $M^1$ or $M^2$ of the Group 1 includes a metal element, a metal complex, P, S, Se, or a combination thereof,

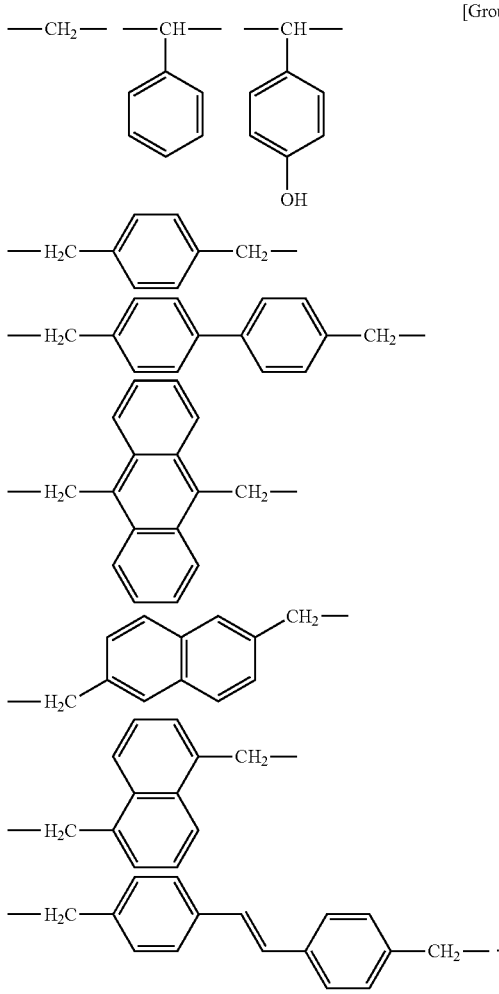

[Group 2]

5. The resist underlayer composition as claimed in claim 1, wherein the compound has a weight average molecular weight of about 1,000 to about 200,000.

6. The resist underlayer composition as claimed in claim 1, wherein the compound is included in the composition in an amount of about 0.01 wt % to about 50 wt %, based on 100 wt % of the solvent.

7. The resist underlayer composition as claimed in claim 1, wherein the solvent includes at least one of propylene glycol monomethyl ether acetate, propylene glycol monomethyl ether, cyclohexanone, or ethyl lactate.

8. The resist underlayer composition as claimed in claim 1, further comprising a cross-linking agent.

9. The resist underlayer composition as claimed in claim 8, wherein the cross-linking agent includes at least one of an amino resin, a glycoluril compound, a bisepoxy compound, a melamine compound, or a melamine derivative.

10. The resist underlayer composition as claimed in claim 8, wherein the cross-linking agent is included in the composition in an amount of about 0.001 wt % to about 3 wt %, based on 100 wt % of the resist underlayer composition.

11. A method of forming patterns, the method comprising:
providing a material layer on a substrate,
applying the resist underlayer composition as claimed in claim 1 on the material layer,
heat-treating the resist underlayer composition to form a resist underlayer,
forming a photoresist layer on the resist underlayer,
exposing and developing the photoresist layer to form a photoresist pattern,
selectively removing the resist underlayer using the photoresist pattern to expose a part of the material layer, and
etching an exposed part of the material layer.

12. The method as claimed in claim 11, wherein the resist underlayer composition is applied using a spin-on-coating method.

13. The method as claimed in claim 11, wherein the resist underlayer composition is heat-treated at about 150° C. to about 500° C.

14. The method as claimed in claim 11, further comprising forming a bottom anti-reflective coating prior to forming the resist underlayer.

* * * * *